(12) United States Patent  (10) Patent No.: US 7,607,117 B2
Lin  (45) Date of Patent: *Oct. 20, 2009

(54) REPRESENTING DEVICE LAYOUT USING TREE STRUCTURE

(76) Inventor: Kuoching Lin, 1001 Ridder Park Dr., San Jose, CA (US) 95131

( * ) Notice: Subject to any disclaimer, the term of this patent is extended or adjusted under 35 U.S.C. 154(b) by 316 days.

This patent is subject to a terminal disclaimer.

(21) Appl. No.: 11/295,107

(22) Filed: Dec. 5, 2005

(65) Prior Publication Data

US 2006/0085779 A1  Apr. 20, 2006

Related U.S. Application Data

(63) Continuation of application No. 10/458,106, filed on Jun. 9, 2003, now Pat. No. 7,096,444.

(51) Int. Cl.
  *G06F 17/50* (2006.01)
(52) U.S. Cl. ................. 716/7; 716/16; 716/17
(58) Field of Classification Search .......... 716/2, 716/7–11, 16–17; 707/102
  See application file for complete search history.

(56) References Cited

U.S. PATENT DOCUMENTS

| | | | |
|---|---|---|---|
| 5,175,693 A * | 12/1992 | Kurosawa et al. | ............ 716/17 |
| 6,009,251 A | 12/1999 | Ho et al. | |
| 6,080,204 A | 6/2000 | Mendel | |
| 6,357,035 B1 * | 3/2002 | Gowni et al. | ............ 716/11 |
| 6,530,070 B2 | 3/2003 | Kruse | |
| 6,584,604 B2 * | 6/2003 | Inada | ............ 716/8 |
| 6,625,611 B1 | 9/2003 | Teig et al. | |
| 6,851,099 B1 * | 2/2005 | Sarrafzadeh et al. | ............ 716/10 |
| 7,093,220 B2 * | 8/2006 | Fallon et al. | ............ 716/10 |
| 7,225,423 B2 * | 5/2007 | Bhattacharya et al. | ............ 716/18 |
| 2002/0083410 A1 * | 6/2002 | Wu et al. | ............ 716/19 |

* cited by examiner

*Primary Examiner*—Vuthe Siek
(74) *Attorney, Agent, or Firm*—Klarquist Sparkman, LLP

(57) ABSTRACT

Methods are described herein for using a tree structure representation for searching selected areas of a programmable device layout in order to determine the existing component configuration of a device. The tree structure may be generated by assigning root nodes, branch nodes and leaf nodes to portions of a tree structure. A search algorithm may walk the tree structure representation of the device layout to determine the existing component configuration of the device of a selected portion of the device layout. The tree structure is simplified by each node of a set of sister nodes on the tree representing equally sized sub-area of the device layout. The tree structure is capable of representing units of layout of multiple different sizes and non-uniform layout units that may straddle more than one sub-area.

19 Claims, 18 Drawing Sheets

REPRESENTING DEVICE LAYOUT USING TREE STRUCTURE

CROSS REFERENCE TO RELATED APPLICATIONS

This is a continuation of application Ser. No. 10/458,106, filed Jun. 9, 2003, now U.S. Pat. No. 7,096,444, which is hereby incorporated by reference herein in its entirety.

TECHNICAL FIELD

The technical field relates to electronic design automation (EDA). More particularly, it relates to subdividing a device layout.

BACKGROUND

With the advent of EDA, design of complex hardware systems no longer begins with a hardware circuit diagram. Instead, it begins with a software program that describes the functionality of the hardware system. FIG. 1 provides one general representation of the EDA process. At 110, a software program may be written in hardware description language (HDL) (e.g., VHDL and Verilog) that defines an algorithm to be performed with limited implementation details. Then at 120, designers may use logic and physical synthesis tools to ultimately generate a netlist which includes a list of components in the circuit design and the interconnections between the components. At this synthesis level, designers may generate alternate architectures for the circuit design by modifying constraints (such as clock period, number and type of data path elements, and desired number of clock cycles). Then at 130, the netlist and information about the layout of the circuit design may be used to determine the optimal placement of the various components of the circuit design and their routing. Finally, at 140, the physical circuit may be created.

One type of electronic device on which circuits may be created is referred to as a programmable logic device (PLDs). PLDs provide system designers with the ability to quickly create custom logic functions. PLDs may also be reprogrammable, meaning that the logic configuration can be modified after the initial programming. Types of PLDs may include but are not limited to FPGA (Field-Programmable Gate Array), PLAs (programmable logic arrays), PAL (Programmable Array Logic) and CPLDs (complex PLDS). A PLD typically includes an array of individually programmable logic units each of which is changeably interconnected to other programmable logic units on the device and to input/output (I/O) pins. For example, the FPGAs may be comprised of pre-defined programmable logic cells (PLCs). Each of these logic cells may further comprise a pre-defined set of programmable and nonprogrammable components (e.g., gates, look up tables (LUTs), registers etc.). Multiple such logic cells may be replicated throughout the device and the components within may be programmed to implement a circuit design. Within a layout of a FPGA device, the logic cell may be the most basic unit represented and the components within are pre-determined to the extent that they are typically the same across all the logic cells. Besides such basic layout units, the device layout may contain other layout units that represent other device components such as a memory layout unit that represents memory components of a device. However, among PLDs all other components of a device (e.g., memory) may be uniformly represented with respect to each other. For example, in an FPGA the layout units representing memory components commonly occupy an area of the device layout which may be represented as some multiple of the area occupied by a basic layout unit of the FPGA, which is the logic cell layout unit.

Other devices such as application specific integrated circuits (ASICs) may also be programmed to implement a custom circuit. For example, the gate array type of ASICs are comprised of multiple pre-defined sets of programmable gate arrays that may be programmed (much like a PLD) to implement a particular circuit design. In such devices, much like an FPGA, the basic unit of the layout, which in this case is a gate array, may be replicated multiple times through out the device. In general, all other components of the device may be typically represented as occupying an area which is a multiple of ten area occupied by of the basic layout unit.

When a designer uses EDA tools to model the implementation of a function on a device (e.g., FPGA, gate array ASIC), not all the available components of a device may be used for a particular implementation. Thus, it may be desirable for a designer to be able to see a graphical representation of the device layout in order to optimize the placement and routing of the circuit. For example, a designer may wish to define an area of a device layout and formulate a query requesting information about the device components within that area. A designer may also wish to know the type and number of unused components within an area. He or she may also wish to interactively change the placement and routing on a particular implementation based on the results of such a query or upon seeing a graphical representation of the device layout in its current form. This optimization process may also be automated through an algorithm that queries information regarding a device layout and automatically improves the circuit design by altering placement, routing and other variables. For these and other reasons it may be desirable to search a device layout to determine information such as what components are still available for programming.

Searching a device layout to determine information may be complicated by the fact that each device might have large numbers of components located within the areas to be searched. Furthermore, besides the basic layout units, the device layout may show other structures such as memory cells, CPUs etc., which may or may not conform to a physical representation that is uniform with the basic layout units.

Several known search methods have attempted to simplify the search process by dividing the layout area into conceptual sections or sub-areas and searching the individual sections to identify individual layout units (e.g., the basic logic cell, memory cells structure, etc.) and any components contained within. One such known division method is known as the binning structure. The binning structure method divides all device layouts, regardless of their physical dimensions, to some fixed number of sub-areas in the horizontal and vertical directions. Such a method may not be flexible enough to uniquely identify all layout units. For example, the size of a sub-area cannot be changed in some cases to accommodate the layout units of different physical sizes. Thus, some of the larger layout units (e.g., memory or CPU) may be represented within or straddle multiple sub-areas of the layout. This complicates the search process because the conflicts between multiple overlapping sub-areas representing the same unit on the layout has to be resolved somehow. Other known conventional methods of subdividing the physical layout of a device such as the HV-VH (horizontal-vertical and vertical-horizontal) and quadruple division all suffer from similar inflexibility. Thus, there is a need for a more effective method of subdividing the physical layout of a device.

SUMMARY

As described herein, a tree structure may be used to represent the layout of a programmable device and its components. In one aspect of such a method, the device layout may be divided into multiple main portions with each portion being represented by a separate root node of the tree structure. Then each portion may be iteratively sub-divided into equally sized sub-areas with each such sub-area being represented by a branch node of the tree structure. However, if any sub-area intersects or corresponds to a unit of the device layout, then such a sub-area may be represented as a leaf node of the tree structure. Thus, the tree structure may be used to represent components of different sizes.

In another aspect, the device layouts with units having a size, location etc., that would otherwise result in undesirable straddling of more than one of the equally sized sub-area may be assigned a separate root node. Then the portion of the core area occupied by such a straddling layout unit may be represented by faux cell units which correspond to leaf nodes of a tree structure under the root node of the corresponding main portion. Furthermore, each such faux cell may be assigned a pointer for associating the faux cell to its appropriate parent.

In yet another aspect, the tree structure representation may be used to search and retrieve information related to a user defined or selected area of a device layout by discovering leaf nodes that represent sub-areas that intersect with the user defined search area.

Additional features and advantages will be made apparent from the following detailed description of illustrated embodiments, which proceeds with reference to accompanying drawings.

DETAILED DESCRIPTION

Device Representation Prior to Synthesis

Figure 1:
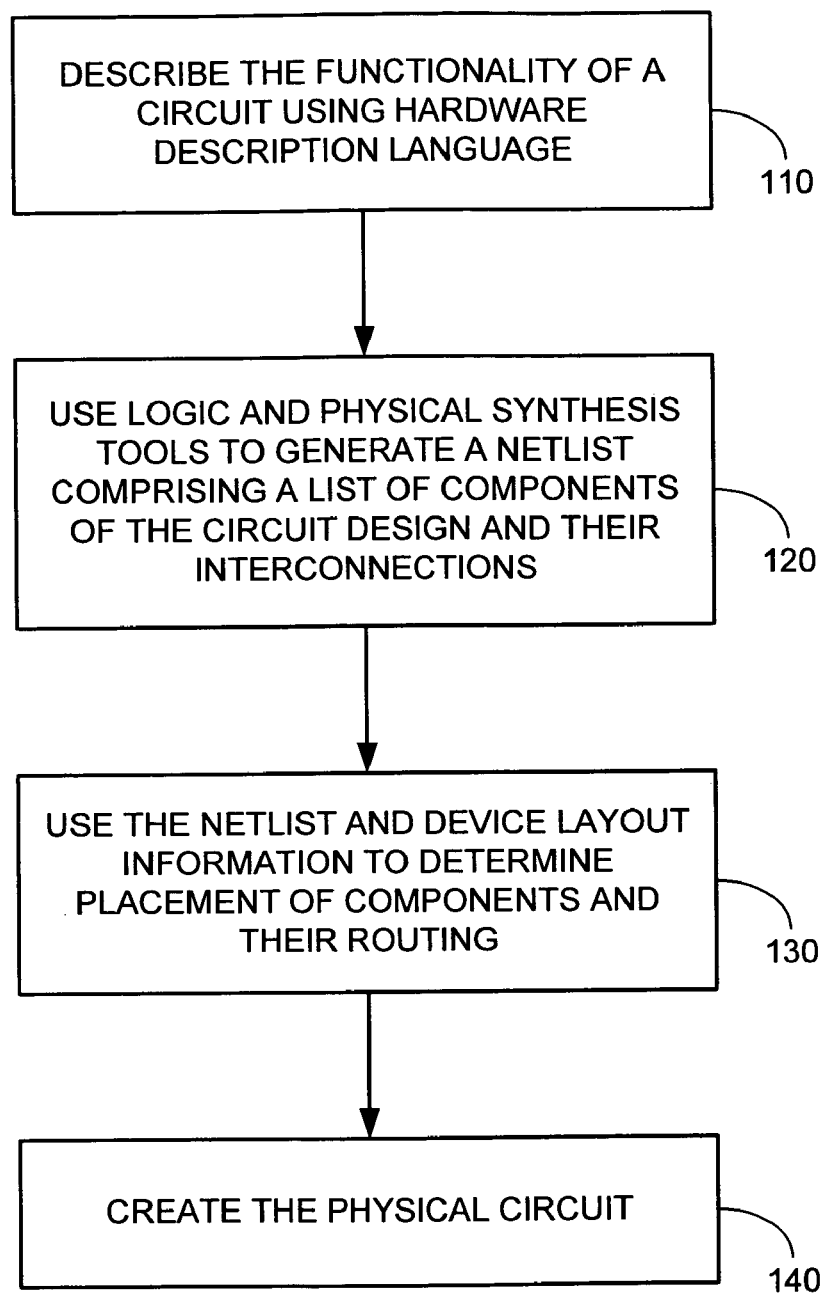
FIG. 1 is a flow chart describing one example of a method for using electronic design automation tools for designing circuits.
Figure 2:
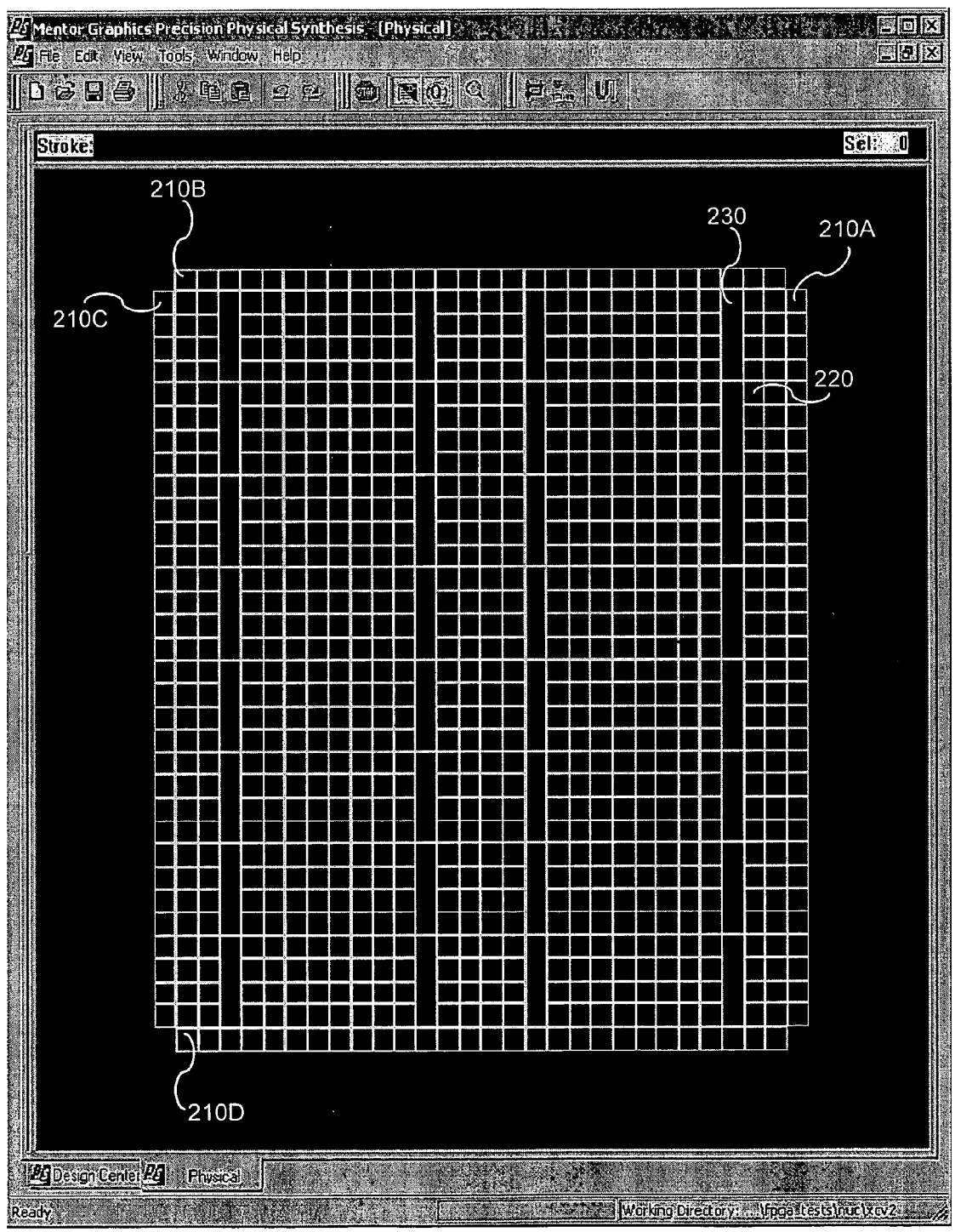
FIG. 2 is a graphical representation of a layout of an exemplary programmable device prior to applying synthesis tools for generating a netlist.

FIG. 2 shows a graphical representation of the device layout of an exemplary device (e.g. FPGA) prior to applying a synthesis tool to model the implementation of a chosen algorithm on the device. The outer boundary of the device representation shows four arrays (210 A-D) of I/O cells and the rest of the device, which contains the logic cells and other components (e.g., memory) of the device, in this example, is the core of the device. Each distinct layout unit of the device is represented in FIG. 2 within a yellow boundary. For example, the component 220 represents a logic cell and the component 230 represents a memory cell. Furthermore, each logic cell 220 may contain with it multiple resources (e.g., LUTs, registers, logic gates).

Device Representation Post Synthesis

Figure 3:
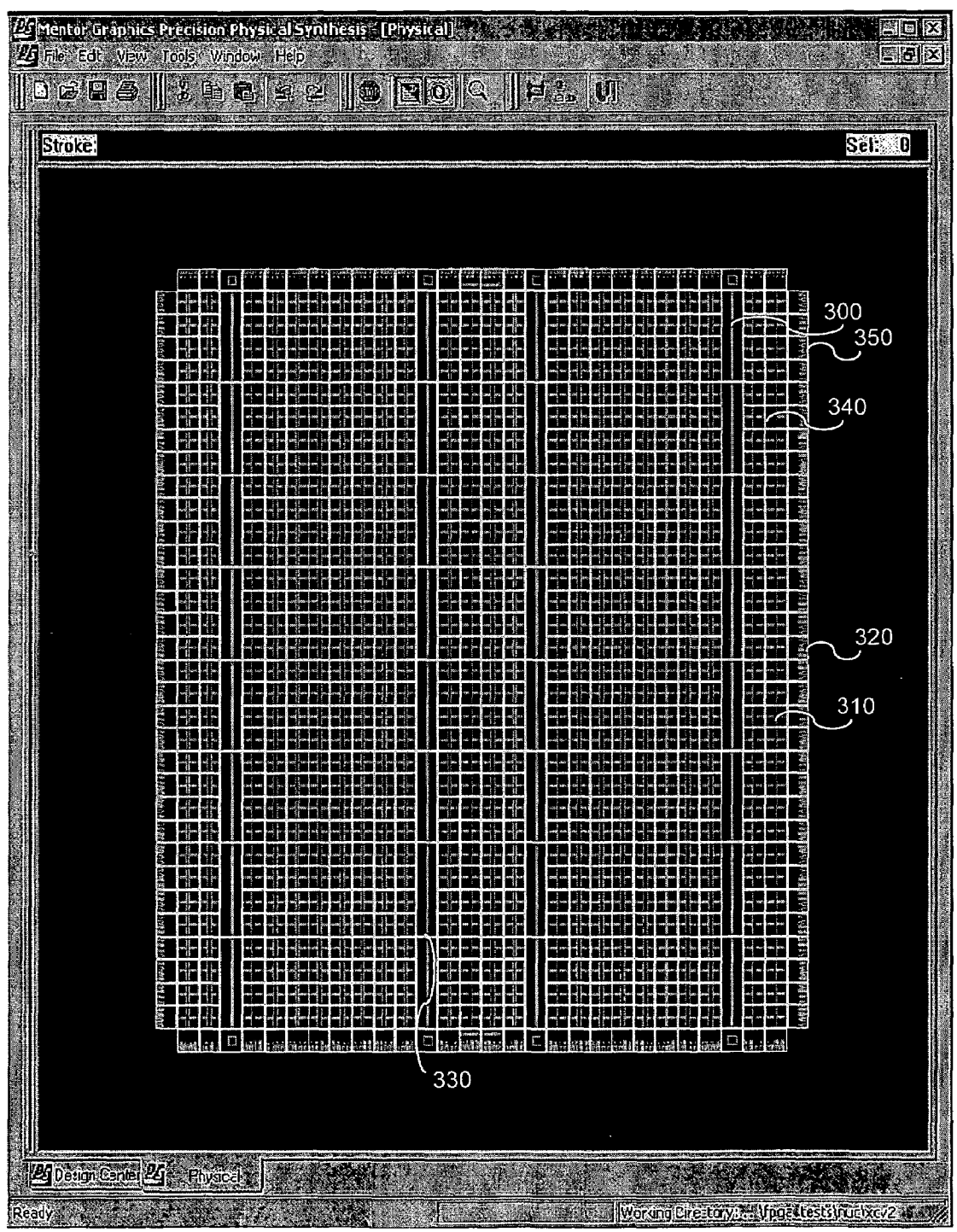
FIG. 3 is a diagram illustrating a layout of the programmable device of FIG. 2 after a designer has applied synthesis tools to generate a netlist.

FIG. 3 shows a graphical representation of the device of FIG. 2 after the designer applied synthesis tools to model the implementation of a program or function on a device. However, in typical circuit design tasks not all logic cells and other components of the device are needed to implement a given program. Thus, the post synthesis representation of the device layout at FIG. 3 shows the used logic cells, used I/O cells, and used memory cells (e.g., 310, 320 and 330 respectively) in green and the unused logic cells, unused I/O cells, and unused memory cells (e.g., 340, 350 and 360) in gray (also referred to as shadowed). A designer or an automated design optimizing tool may optimize the design by improving the placement and routing. The graphical representation may highlight or otherwise identify areas of the circuit that would benefit from design optimization. In order to do that he or she may wish to query what components (e.g., LUTs, registers, gates etc.) are within a given area of the device layout and which among them are free to be used. Based on this information, the designer or the automation tool may choose the device components to be used for a particular implementation based on their location on the layout. This may result in improved performance, such as reduced propagation delays.

A Method for Searching a Device Layout

Figure 4:
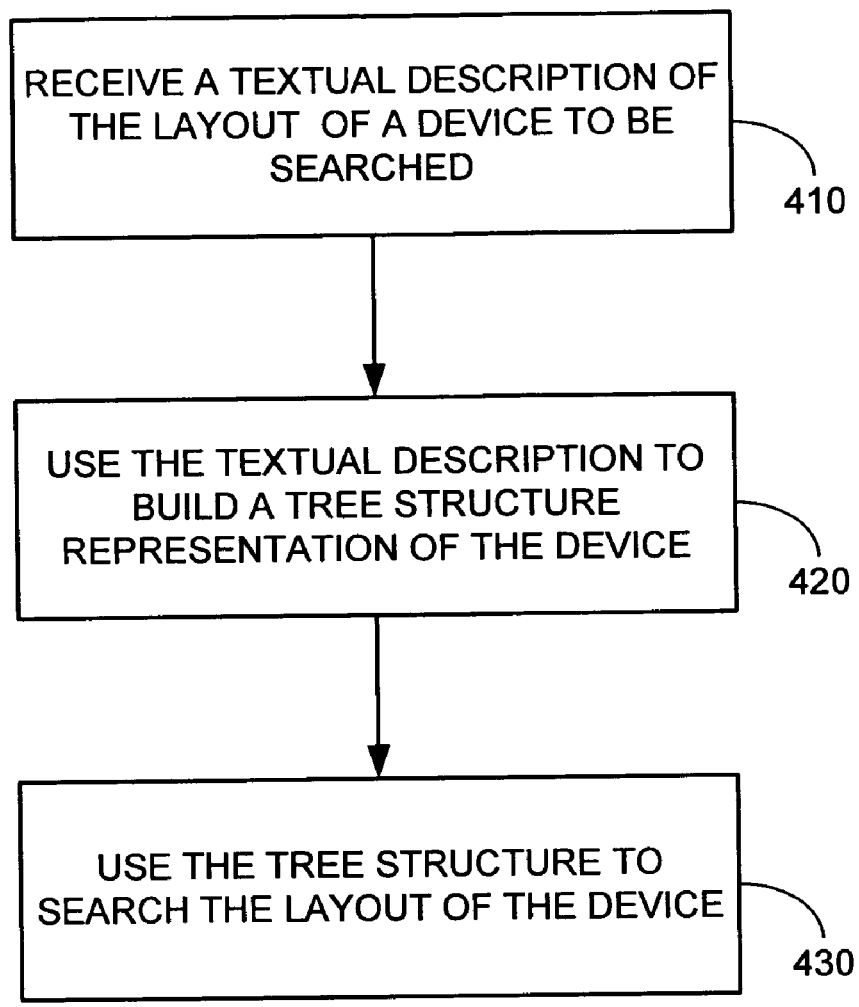
FIG. 4 is a flow chart describing one embodiment of an overall method for using a tree structure representation of a device layout for searching the layout to discover information related to components of the device.

On a complex device layout with a large number of logic cells and other components it may be desirable to divide the device layout into smaller areas for conducting the search for components within a chosen area of the layout. For example, the designer may wish to search only a part of the device layout. FIG. 4 describes one embodiment of a general overall method for searching a device layout by sub-dividing the layout into sections. At 410, a textual description of the device to be searched is received. The textual description may be in any form that is suitable for the particular EDA tool on which the search algorithm will be implemented. The description may include information such as the physical size of the basic layout unit of the device, the physical sizes of the memory units and other information regarding the components of the device. Based on such a description, at 420, a tree structure may be generated to represent the device. Then at 430, when a search or a query is received, the tree structure may be used to search the layout of the device.

Generating a Tree Structure Representation of a Device Layout

Figure 5:
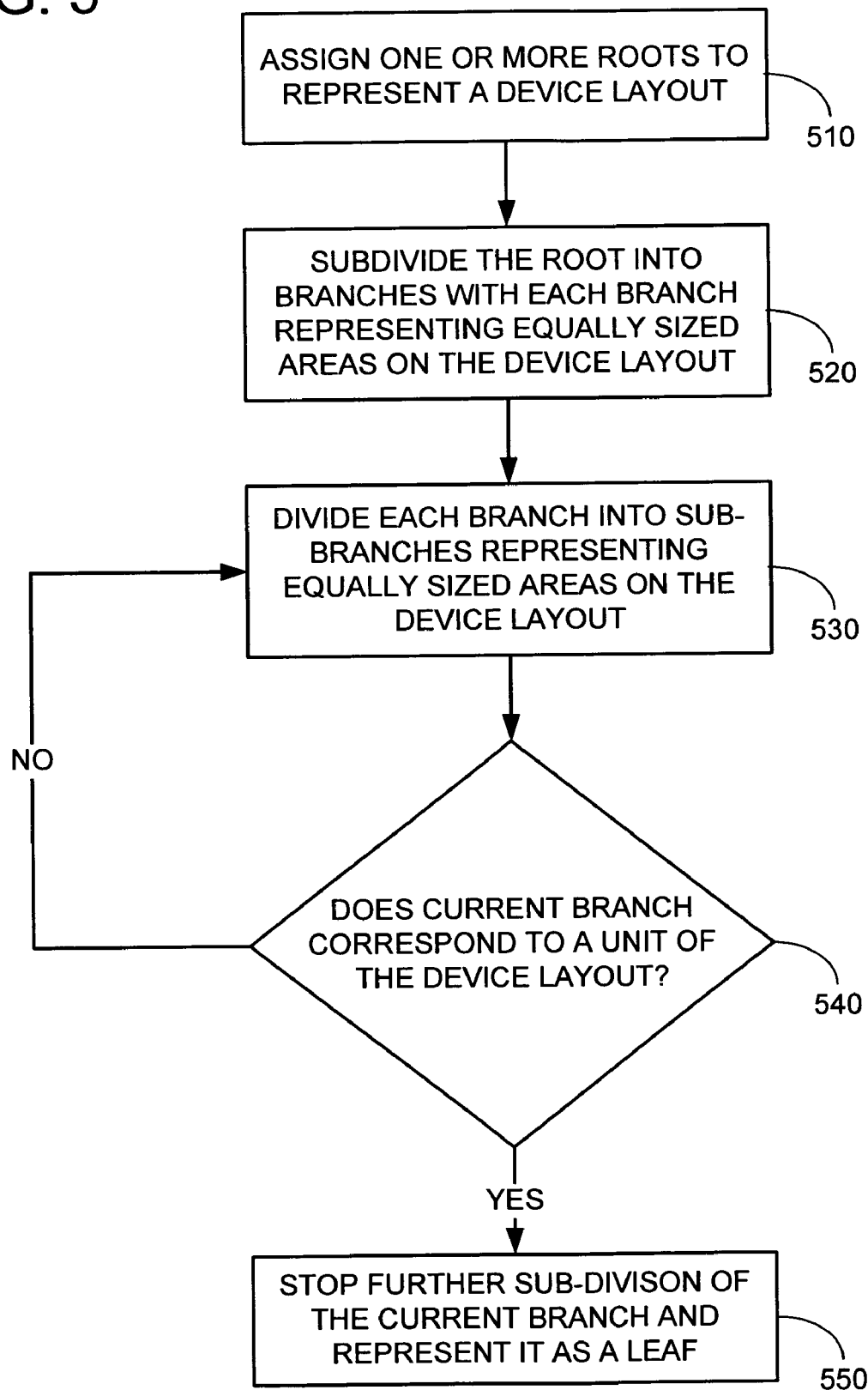
FIG. 5 is a flow chart describing an example of an embodiment of a method for building a tree structure representation of a device layout.

FIG. 5 describes one embodiment of an approach for generating a tree data structure which represents the components of a device. The embodiment of FIG. 5 involves iteratively dividing areas of the device layout, which may then be searched to determine information (e.g., number and type of available device components). At 510, one or more tree roots are assigned to represent a device layout with each root representing a selected portion of the device layout area. At 520, each root is subdivided into branches with each branch representing a sub-area on the device layout that is equal in size to areas represented by the other branches. Then at 530, this subdivision into equally sized sub-areas to be represented by branches is continued until, at 540, where, if the sub-area of the layout represented by the current branch actually corresponds to a unit on the device layout (e.g., logic cell unit, memory unit) then that branch is designated at 550 as a leaf node and the sub-area corresponding to it is no longer subdivided. As described further below, it is these leaf nodes of the tree structure that will be used to answer queries such as what components are present within selected areas of the device layout. For example, the query may return results related to the number of LUTs, registers, gates and memory that may be present within a selected area. However, if the sub-area of the layout represented by the current branch does not correspond to an actual unit of device layout (e.g., logic cell unit, memory unit) then the sub-area is further divided (530) until a lower level sub-area does correspond to an actual unit of the device layout. Thus, it is possible to use the method above to represent as a tree structure leaf nodes corresponding to units of a device layout of different physical dimensions.

An Example Tree Structure

Figure 6:
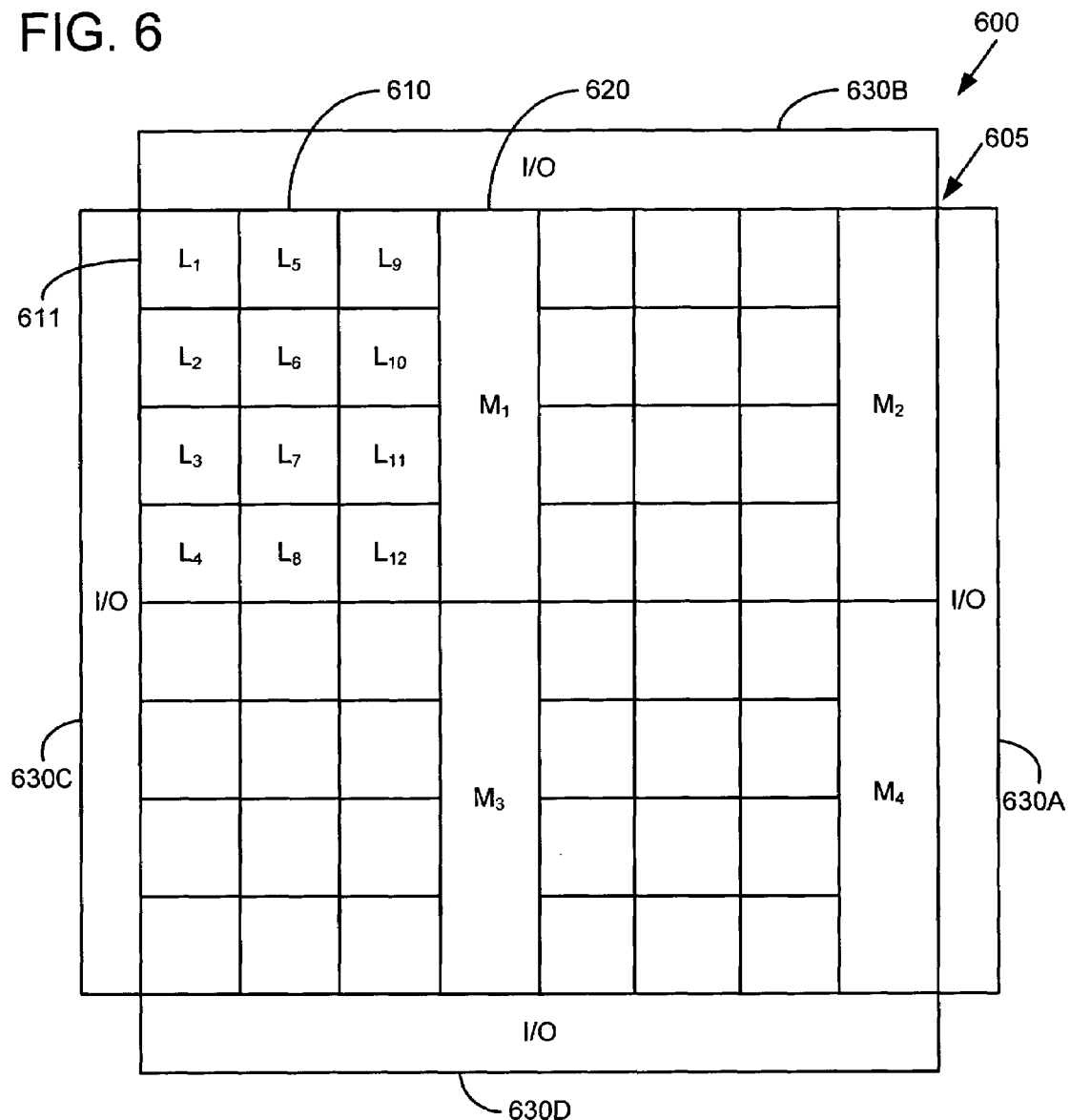
FIG. 6 is a block diagram illustrating an example of a layout of a programmable device with various layout units of different sizes to be represented within one tree structure.
Figure 7:
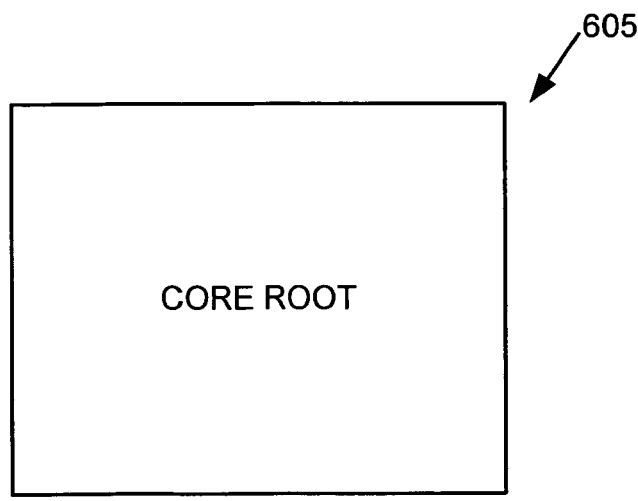
FIG. 7 is a block diagram of a core area of a device layout to be represented as a root node in a tree structure representation of the device layout.
Figure 8:
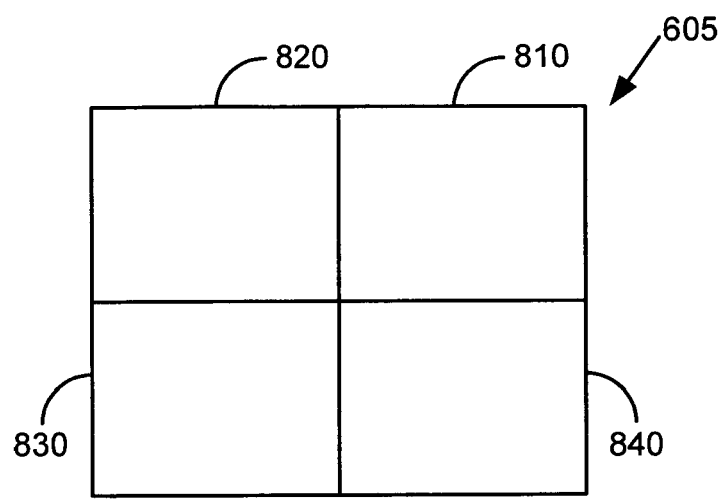
FIG. 8 is a block diagram illustrating the core area of the device layout of FIG. 7 being sub-divided into four equally sized sub-areas to correspond to branch nodes of a tree structure.

FIGS. 6-12 use an example device to illustrate an embodiment of a method of subdividing a device layout into rectangular areas and sub-areas for representing it in form of a searchable a tree structure. FIG. 6 shows a simplified graphical representation of a device layout 600 such as the exemplary FPGA of FIG. 2 with layout units of different dimensions. The device has a core area 605 containing layout units such as logic cells 610 (labeled $L_1$-$L_{12}$) and memory cells such as 620 (labeled $M_1$-$M_4$). Cells outside the core area on the boundary of the device 630A-D comprise I/O cell structures for communicating outside the device. Note that the device layout as represented has layout units of multiple different sizes. For example, the most basic unit of the device layout of FIG. 6 is a single logic cell 611 (e.g., $L_2$) but the layout also shows a larger layout unit 620 (e.g., $M_2$) which represents a memory cell. However, the larger unit 620 has a size which is a multiple of the size of the smallest and most basic unit at 610 (here $M_1$ is four times the size of $L_1$). This feature may help in allowing the device layout to be divided into sub-areas of equal sizes for generating a tree structure with each node of the tree representing one such sub-area. Besides an FPGA, other PLDs such as PLAs, PALs, CPLD etc. may also have a device layout with layout units that represent a pre-defined set of programmable components and wherein the larger layout units have a size that is a multiple of the size of the basic units. Gate array ASICs and other devices not mentioned may also have such a layout.

The subdividing process may begin with assigning portions of the device layout area to roots of different trees. For example, as shown in FIG. 6, the core area 605 may be assigned a root node. Likewise, each of the I/O cell groups 630A-D may also be assigned a separate root. At this level, it may be beneficial to assign roots to main portions of device layout area such as its core area and the area covered by the I/O cells. However, it is also possible to assign a root to any selected portion of the device layout area. As the number of roots increase, the complexity of tree structure representation also increases. The effectiveness of a search conducted with aid of the tree structure may be reduced as the number of roots increases beyond a certain level.

Figure 9:
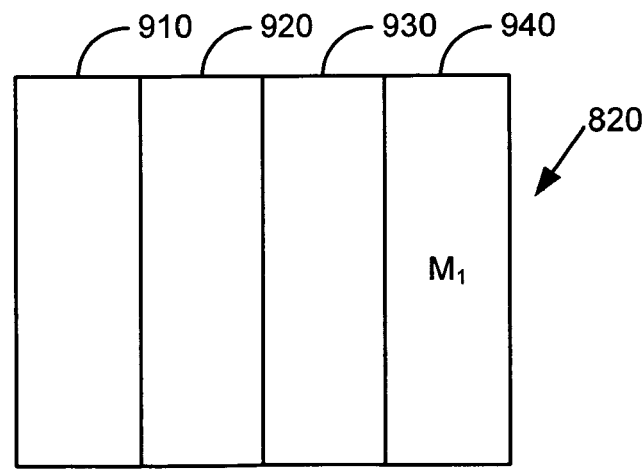
FIG. 9 is a block diagram illustrating one of the sub-areas of FIG. 8 being sub-divided into four equally sized sub-areas to correspond to branch nodes of a tree structure.
Figure 12:
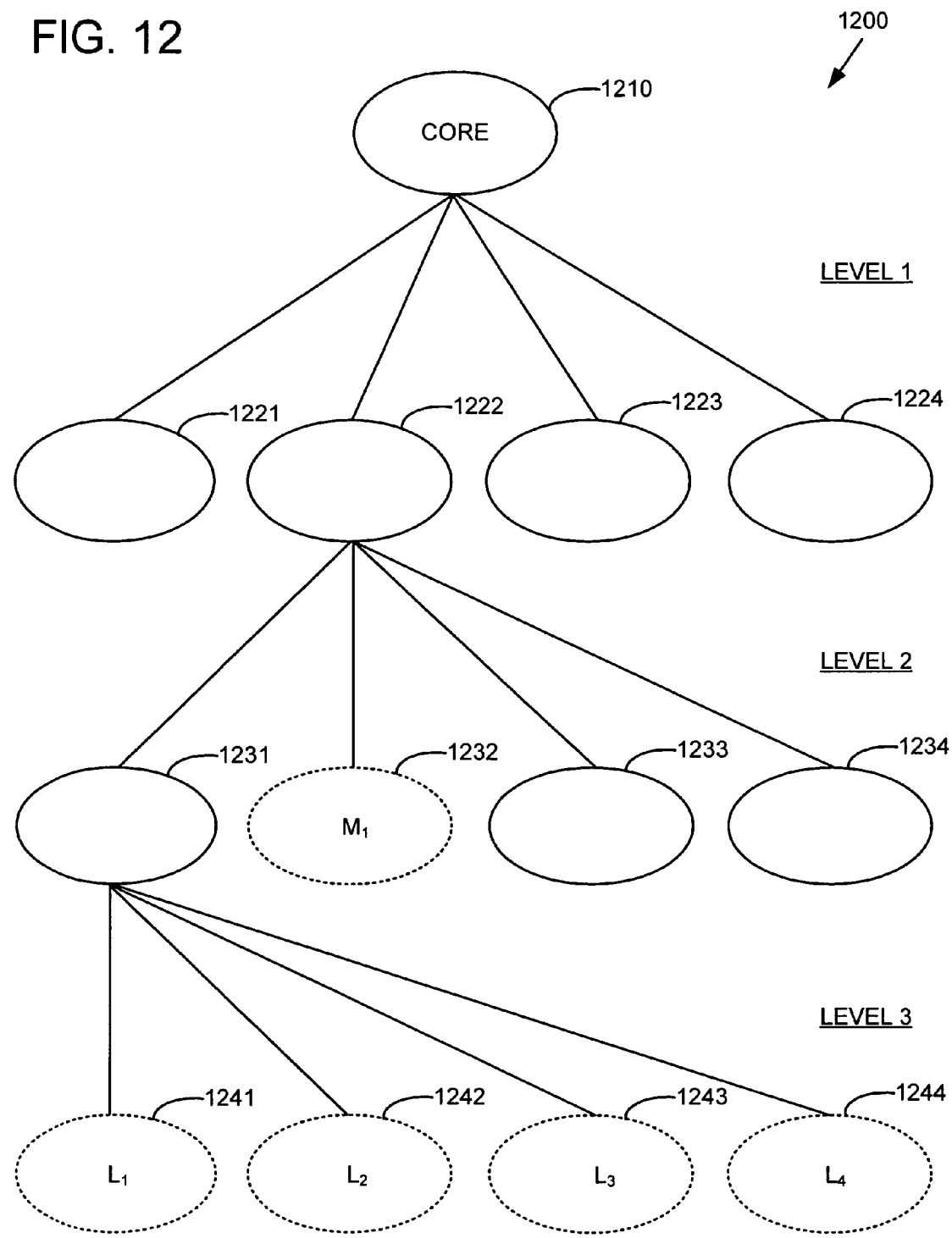
FIG. 12 is a block diagram illustrating a tree structure representation of the device of FIG. 6.

With reference to FIGS. 7-12, FIG. 7 shows the core area 605 being designated as a root 1210 of a tree structure 1200 of FIG. 12. Then at FIG. 8, the area representing the core 605 is divided into four equally sized sub-areas 810, 820, 830, and 840 to be represented as level 1 branches 1221, 1222, 1223 and 1224 in FIG. 12. Then as shown in FIG. 9, one or more of the four sub-areas 810, 820, 830 and 840 can be further divided into four equally sized sub-areas of a lower level. FIG. 9 shows the sub-area 820, corresponding to the branch node 1222 on the tree structure of FIG. 12, being further divided into equally sized sub-areas 910, 920, 930 and 940. Sub-areas 910, 920, 930, and 940, are lower level areas represented in FIG. 12.

Figure 10:
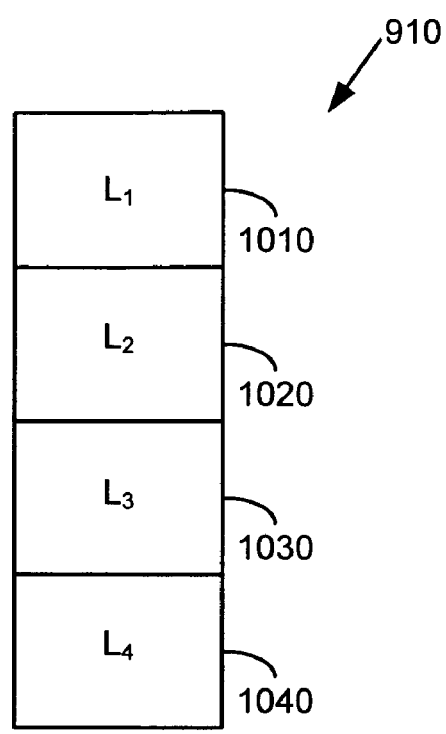
FIG. 10 is a block diagram illustrating one of the sub-areas of FIG. 9 being divided into four equally sized sub-areas to correspond to leaf nodes of a tree structure.
Figure 11:
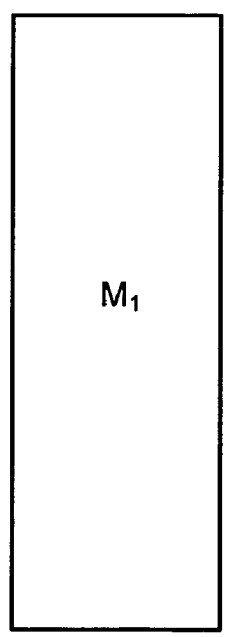
FIG. 11 is a block diagram illustrating one sub-area of FIG. 9 that corresponds to a leaf node of a tree structure.

According to the method of FIG. 5 at 540, further subdividing may stop once a sub-area represented by a branch node corresponds to a layout unit (e.g., logic cell unit, memory unit) of the device layout. The memory cell 940 (M1) is one such structure, which can be designated as the leaf node 1232 (FIG. 12) of a tree and no longer subdivided (FIG. 12 shows the leaf nodes as ellipses with a dashed line). However, the sub-areas 910, 930 and 940, that are represented in FIG. 12 by the branch nodes 1231, 1233 and 1234, do not yet correspond to a single actual unit of the device layout. Instead multiple logic cells may be contained within each of these sub-areas. Thus, these areas may be subdivided further into lower into sub-areas. FIG. 10 shows the sub-area 910 further subdivided into sub-areas 1010, 1020, 1030 and 1040, represented in FIG. 12 by the level 3 branch nodes 1241, 1242, 1243 and 1244. At this level, the sub-areas 1010, 1020, 1030 and 1040 do in fact correspond to some of the logic cell layout units 610 on the core area 605 of the device. Thus, these nodes can be represented as the leaf nodes (dashed lines in FIG. 12) and not be divided any further. In this manner, basic units of a device layout such as logic cell unit 610 and memory unit 620, each being of different physical dimensions than the other, can still be represented as leaf nodes of the same tree structure. More importantly, these layout units with different sizes can each be represented by a respective single leaf node, thus reducing the complexity of a search of the device layout.

Preferably, each area represented by a branch node is subdivided into equally sized areas. However, the size of such a division does not have to be the same for all the nodes at the same level. For example, the area represented in FIG. 12 by the branch node 1222 is shown as being divided into four equally sized areas. However, that does not require that the area represented by its sister node 1223 be divided into the same four equally sized areas. Instead, it may be divided into any number (e.g., 2, 3, 4 etc.) of equally sized areas. This allows the flexibility to represent different size units located in different parts of a device layout.

Figures 13, 14:
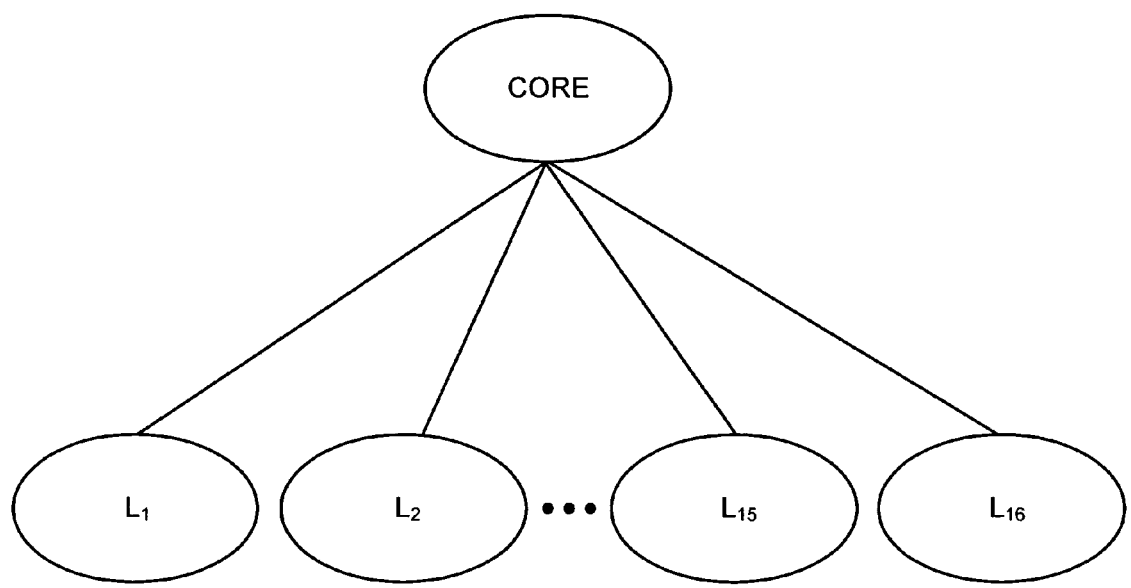
FIG. 13 is a block diagram illustrating an example of simple device layout with layout units all being of an equal size.
FIG. 14 is a block diagram of a tree structure representation of the simple device layout of FIG. 13

Also, FIG. 12 shows the tree structure representation of device layouts with multiple levels. However, much simpler device layouts such as the one shown in FIG. 13 can be represented by a single level tree structure, such as the one in FIG. 14. The number of levels of tree structure for representing a device layout may depend in part on the diversity of its layout units. The tree structure as described above can be expressed at any number of levels and even each part of the tree structure can be at different levels (e.g., the node 1232 only reaches down to level 2 but the node 1231 reaches down to level 3).

Enhanced Tree Structure Representation

Figure 15:
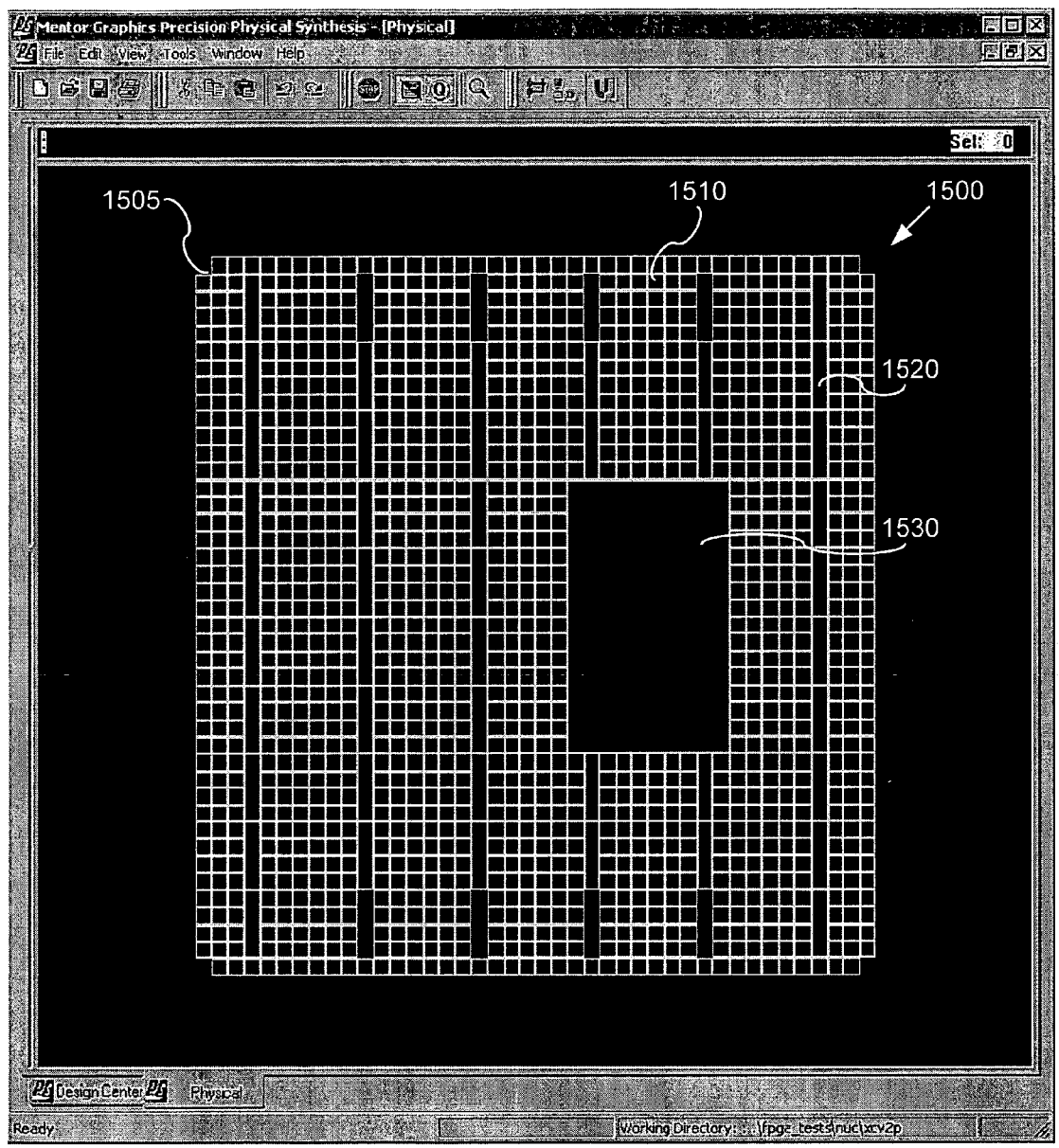
FIG. 15 is a diagram of an exemplary layout of a programmable device with a large non-uniform layout unit that may straddle multiple sub-areas of the device.

Device layouts with various layout units having some degree of uniformity among their various physical sizes may be more easily represented as a tree structure for searching as opposed to those that lack such uniformity. One form of uniformity may be as a result of the size of the larger units of the device layout being a multiple of the most basic units. For example, the devices shown in FIGS. 2 and 6 have larger units (e.g., memory) that are multiples of the smallest unit (e.g., logic cell). However, other factors may also reduce uniformity among components that adds to the complexity of tree structure representation. For example, FIG. 15 shows a device layout which has units of three different sizes such as logic cell unit 1510, memory unit 1520 and a large Central Processing Unit (CPU) at 1530. Both the memory unit 1520 and the CPU 1530 in this example are multiples of the most basic unit of the device layout (i.e., the logic cell 1510). Thus, as described above, the memory unit such as 1520 may be represented on a tree structure as a leaf node (e.g., 1232). However, due to its size, the CPU unit 1530 may not lend itself to be represented as a leaf node of a tree structure under the same root as those of the smaller components 1510 and 1520.

Figure 16:
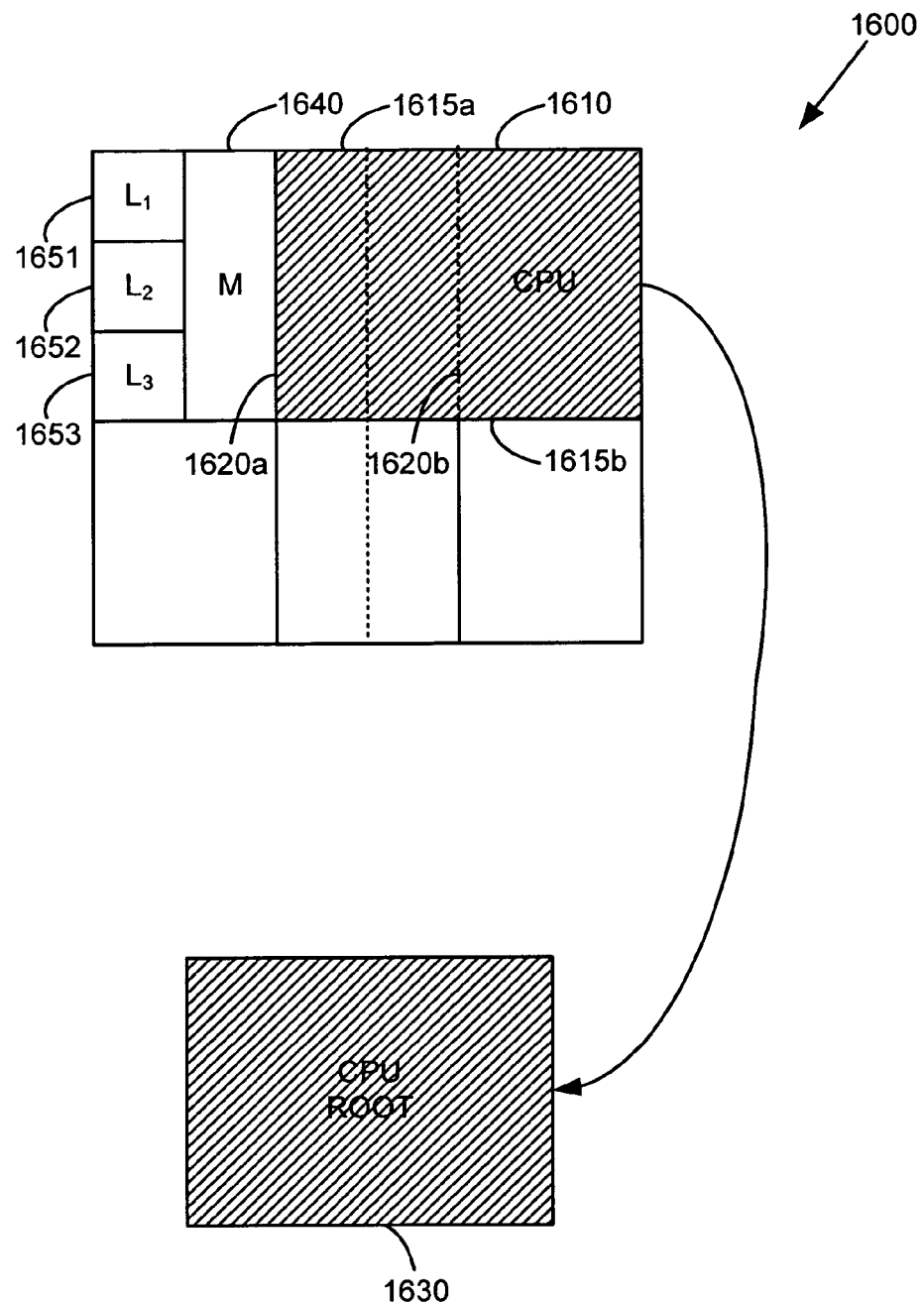
FIG. 16 is a block diagram illustrating a large exemplary non-uniform layout unit, in this case a CPU, straddling multiple sub-areas of the device with the CPU being assigned a separate root node of its own.

The tree structure described above is generated by dividing the layout of the device into equally sized sub-areas and representing those divisions that correspond to a layout unit (e.g., logic cell unit, memory unit) as leafs of the tree structure. In the example shown in FIG. 15, the core area 1505 is 40 basic units wide and 40 basic units (logic cell unit) tall, whereas the CPU unit 1530 is 10 basic units wide and 16 basic units tall. Thus, the core area 1505 cannot be divided into any form of equally sized sub-areas of the layout that fits the entire CPU 1530 into one such section. Similarly, FIG. 16 illustrates such a non-uniform device component 1610 that straddles more than one equally sized sub-area of the core area 1600 of the device layout. In this example, the core area 1600 may, for example, be initially divided into multiple sub-areas of equal sizes (into four areas such as 1615a and 1615b) or at 1620a and 1620b (into six areas). Other divisions are also possible. However, no matter what type of division is chosen, the CPU 1610 will straddle more than one such sub-area. Thus, within the tree representation of a device layout containing such a component, the sub-areas of the device layout occupied by the component may have to be represented across several nodes or branches.

Figure 17:
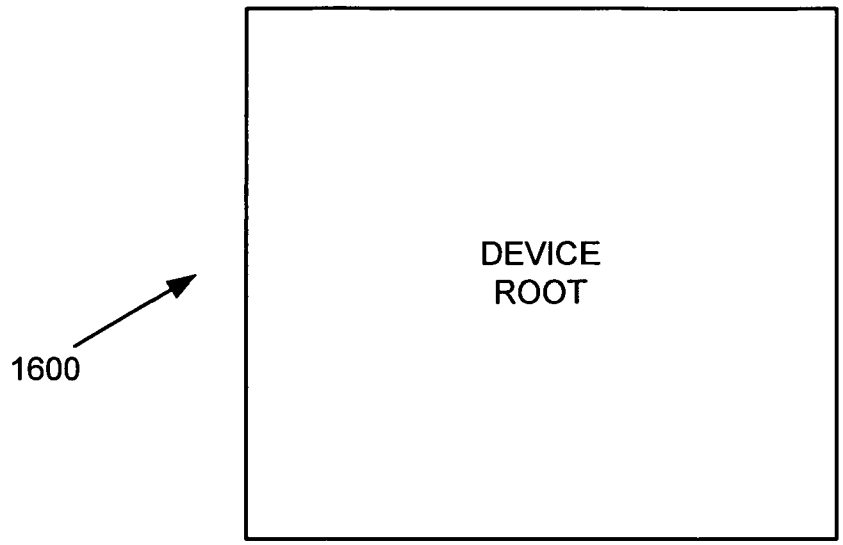
FIG. 17 is a block diagram of the core area of the exemplary device layout of FIG. 16 prior to being subdivided.
Figure 18:
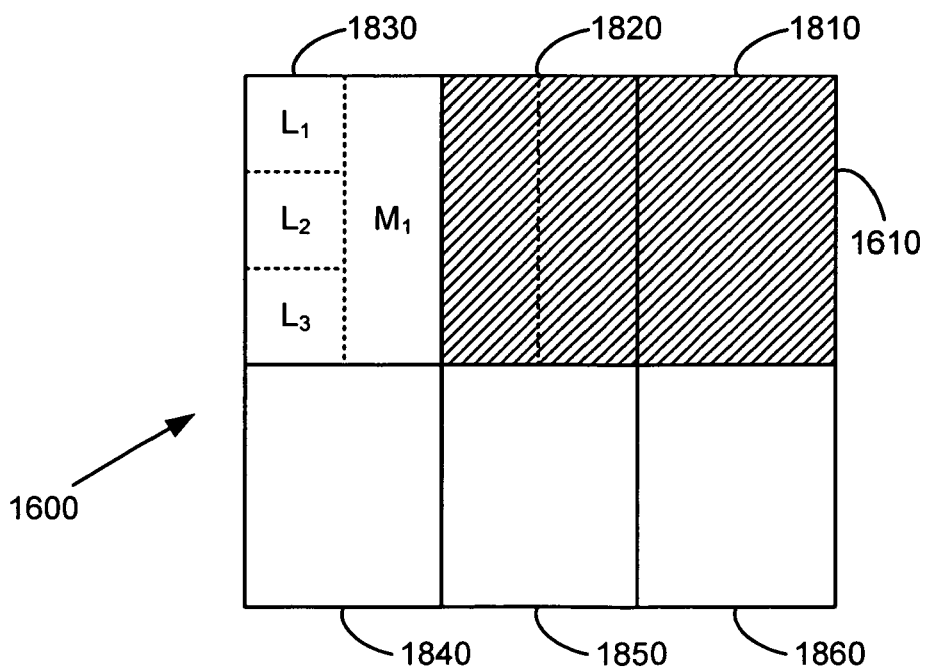
FIG. 18 is a block diagram illustrating the core area of FIG. 17 being divided into equally sized sub-areas to be represented as branch nodes of a tree.
Figure 19:
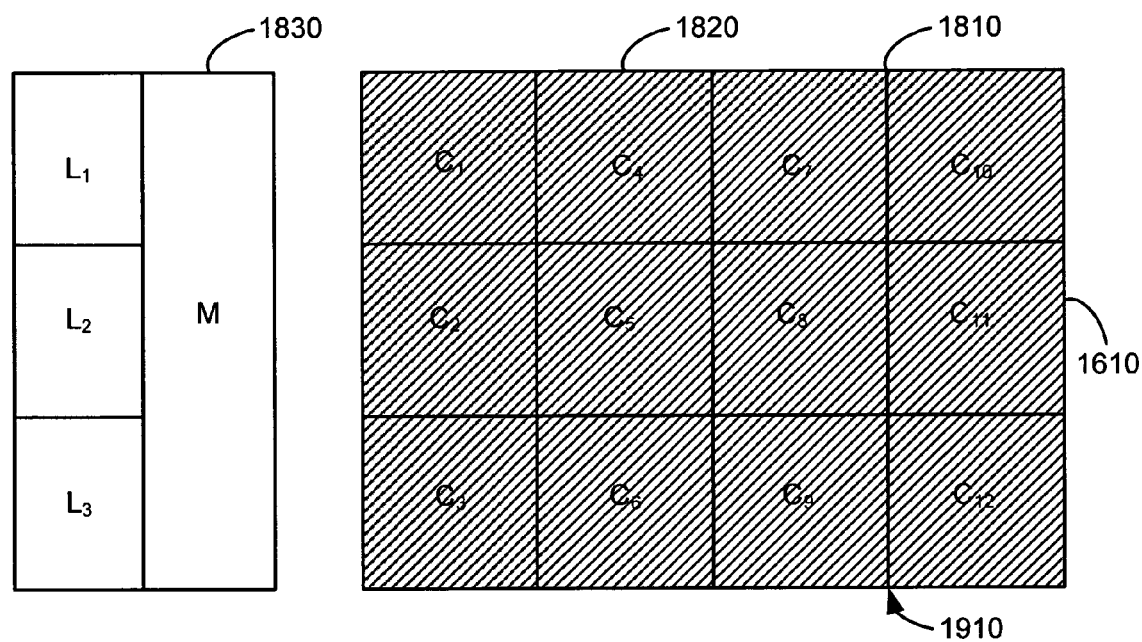
FIG. 19 is a block diagram illustrating faux cells associated with an area being occupied by the straddling non-uniform device layout unit of FIG. 16.
Figure 20:
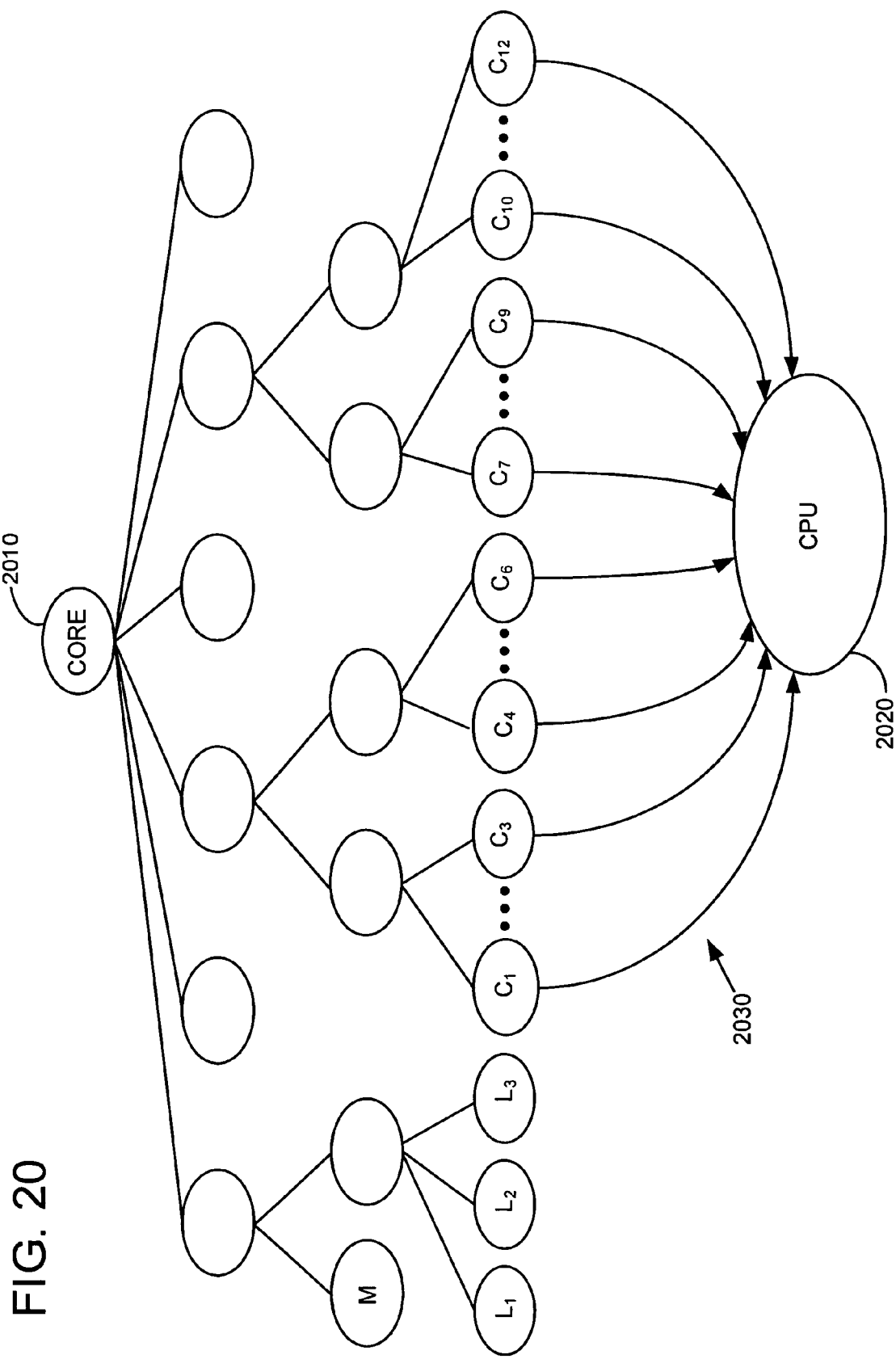
FIG. 20 is a block diagram illustrating a tree structure representation of the device layout of FIG. 16.

However, one embodiment of a way to express such a straddling non-uniform unit 1610 is to assign a separate root 1630 (CPU root) to the unit while maintaining a separate root (at FIG. 17) to represent the entire core area 1600. The core area 1600 may then be subdivided as if the straddling unit is not at its location and instead, it may be represented by faux cells with pointers to the separate root associated with the straddling unit 1610. FIGS. 18, 19 and 20 illustrate this embodiment further.

As shown in FIG. 18, the core area 1600 may, for example, be divided into six sub-areas of equal sizes 1810, 1820, 1830, 1840, 1850 and 1860. The CPU layout unit is a straddling unit because it cannot be contained within just a single of one of these sub-areas of equal sizes (1810-1860). In fact, the sub-areas 1810 and 1820 together encompass the areas occupied by the layout of CPU 1610, whereas the sub-area 1830 in this example corresponds to an area containing logic ($L_1$-$L_3$) and memory cells ($M_1$). As shown in FIG. 19, sub-area 1830 is subdivided further to yield one memory cell and three logic cells. The sub-areas 1810 and 1820 representing the CPU layout unit 1610 can be divided into faux cells 1910 ($C_1$-$C_{12}$) with a pointer or other relationship tracker (links, references, etc.) to the CPU root to establish the relationship between the faux cells 1910 ($C_1$-$C_{12}$) and its true parent, the CPU layout unit 1610. The CPU root, in this example, will have a single leaf and thus the pointer or other relationship tracker may also point to the leaf to establish the relationship between the faux cell units and the CPU layout units.

The faux cells are shown as being the same size as a logic cell. However, the faux cells 1910 ($C_1$-$C_{12}$) may be of many other sizes that will allow subdivision of the layout areas into sub-areas of equal sizes. In this example, the faux cell could have been the same size as the sub-areas 1830.

FIG. 20 shows an example of the tree representation for the core area of the device layout 1600 with a non-uniform straddling unit 1610. This tree structure has two roots, one for the core area 2010, and another to represent the CPU at 2020. All the faux cells ($C_1$-$C_{12}$) at 2030 would have a pointer or other relationship tracker to the CPU root 2020. Thus, a search algorithm walking the tree structure of FIG. 20 can determine that the sub-areas of the core related to the faux cells ($C_1$-$C_{12}$) ultimately belong to the CPU layout unit.

Non-uniformity of a device layout as a result of a straddling unit may also be due to the placement of a unit on a device layout and not just its size. Non-uniformity could also arise because of both size and placement. For example, if a component is placed in the middle of a core area it may straddle all configurations of equally divided sections or sub-areas of the device layout. This may be true even if a component of the same size when placed in another location may not lead to such straddling. Such straddling due to placement of a device component in the layout may also be addressed in the manner described above.

Furthermore, if there is more than one such straddling unit on a layout then the same methods can be applied by assigning each straddling component its own separate root and assigning pointers from the faux cells under the core root back to these roots. Also, the example of a non-uniform straddling component shown in FIG. 16 straddles across more than one sub-area created by the first division of a core area corresponding to the first level below the root of a tree structure. However, such straddling may occur at lower levels of the tree structure as well. When it does, the method described above may be used to represent the straddling device layout unit.

One advantage of choosing equally sized areas to represent nodes or branches of a tree structure representation is its reduced complexity. Such a tree would be simpler to build and simpler to be searched. However, if too many non-uniform layout units are present on a given device layout and each has to be assigned a separate root, this may result in adding complexity back into the task of representing the device layout in form of a tree structure. As an estimate, if more than 50% of the unit on a device layout are non-uniform straddling units then the complexity of the tree structure described above is too much for it to be particularly effective.

Using a Tree Structure to Search a Selected Area of the Layout of a Device

Figure 21:
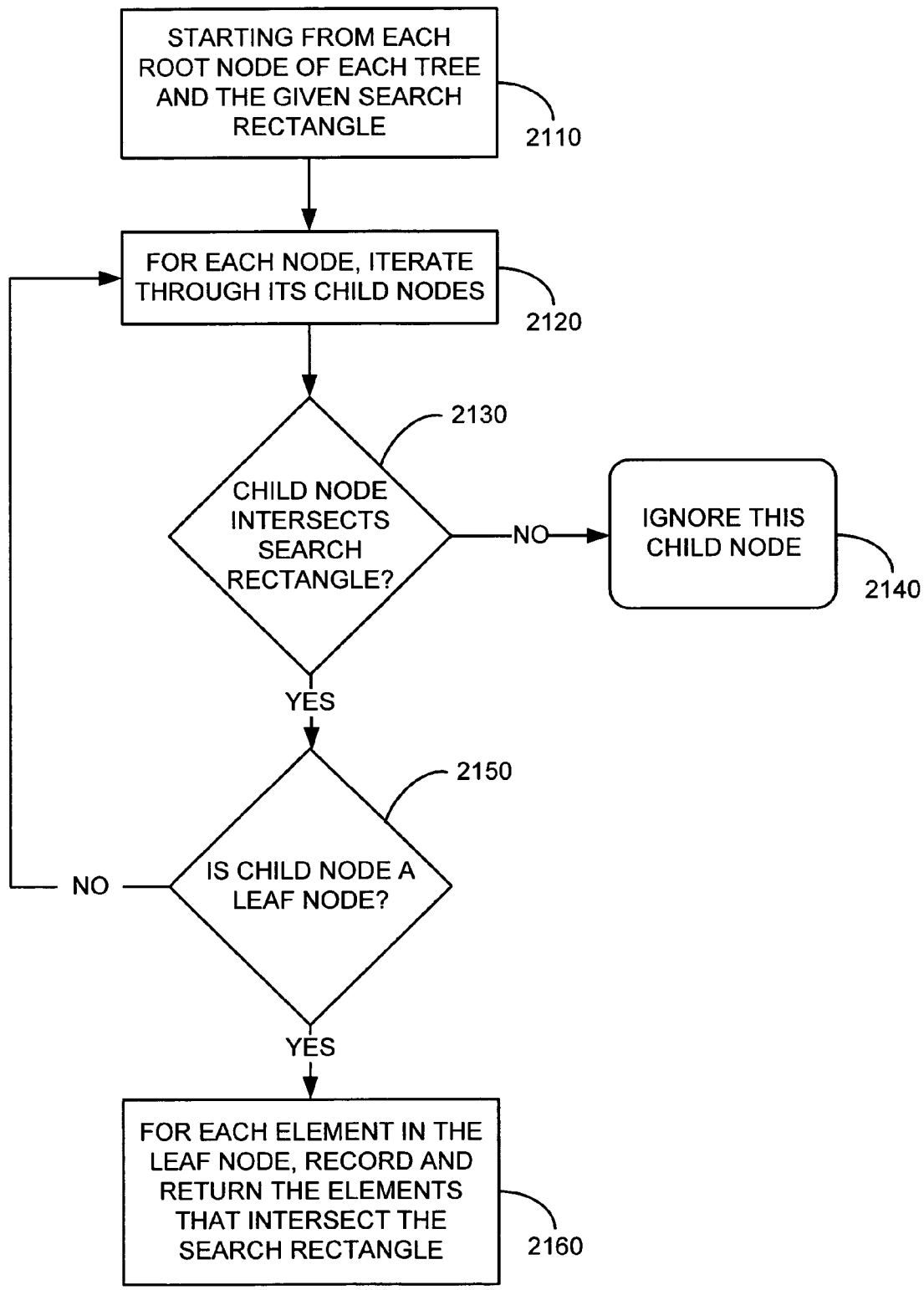
FIG. 21 is a flow chart illustrating an embodiment of a method for searching a selected area of a device layout using a tree structure representation of the device layout.

Once a tree structure is built for representing the layout of a device, it may be searched to yield information about device components. FIG. 21 illustrates one embodiment of a search method. At 2110, the search starts at each root node of each tree and a selected search rectangle. Then at 2120, all child nodes of each branch node is iteratively searched, ignoring those child nodes that are not within the search rectangle (2130 and 2140). If the current child node does intersect the search rectangle then it is verified at 2150 whether the child node is a leaf node. Each leaf node on the tree structure corresponds to a unit of the device layout. Thus, if the child node is a leaf node then at 2160 the leaf node and its elements (such as device components (e.g., LUTs, registers, gates, memory, CPU)) are recorded and returned as part of the results of the search. However, if at 2150 the child node is not a leaf node, then the search is continued at the next level of the child nodes at 2120. Other suitable search methods may be used with the tree structure to search selected areas of a device for its component related information. When the search concerns a device having a non-uniform layout unit such as the straddling unit (e.g., 1610), then the faux leaf nodes (e.g., 1910 ($C_1$-$C_{12}$) related to the area of the straddling component will point to the separate root assigned to the component. A search rectangle including some part of a straddling unit will intersect with one or more faux leaf nodes assigned to the straddling unit and thus, all of these faux leaf nodes may potentially return the straddling unit in the search result. Therefore, if there is more than one faux leaf node that intersects with a search rectangle then the search algorithm may select one of these nodes to return the straddling unit in the results. For example, the algorithm may select only the faux node overlapping within the lower left corner of the search rectangle to return the result. This minimizes conflicts that could otherwise arise if plural faux nodes returned the same result.

Use of a Client-Server Network

Figure 22:
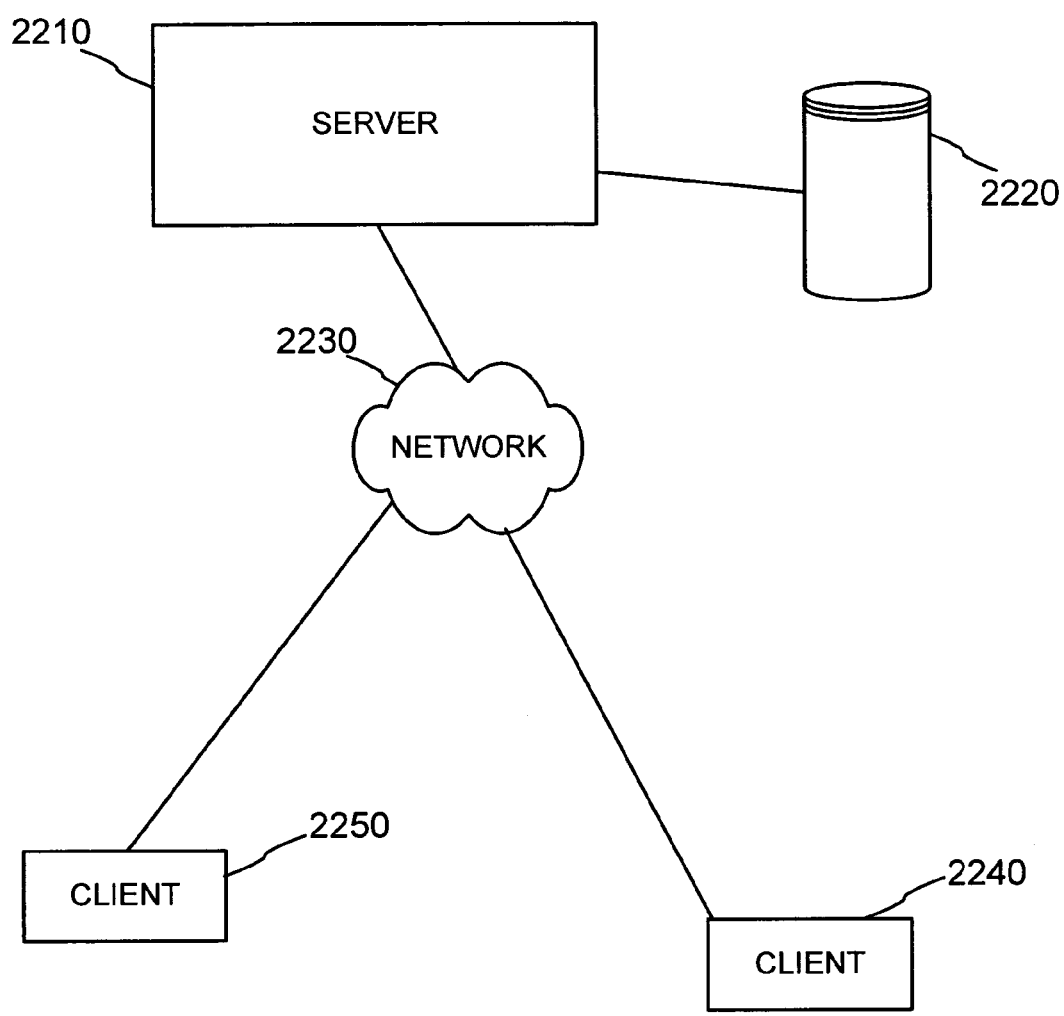
FIG. 22 is a diagram illustrating an exemplary client-server network environment.

Any of the aspects of the method described above may be performed in a distributed computer network. FIG. 22 shows an exemplary network. A server computer 2210 may have an associated memory and database 2220 (internal or external to the server computer). The server computer 2210 may be configured to perform any of the methods associated with the above embodiments. The server computer 2210 may be coupled to a network, shown generally at 2230. One or more client computers, such as those shown at 2240, 2250, may be coupled to the network 2230 and interface with the server computer 2210 using a network protocol. Client computers each typically have a processor, assorted memory, a display such as a monitor, and one or more data entry devices such as a mouse and keyboard.

Figure 23:
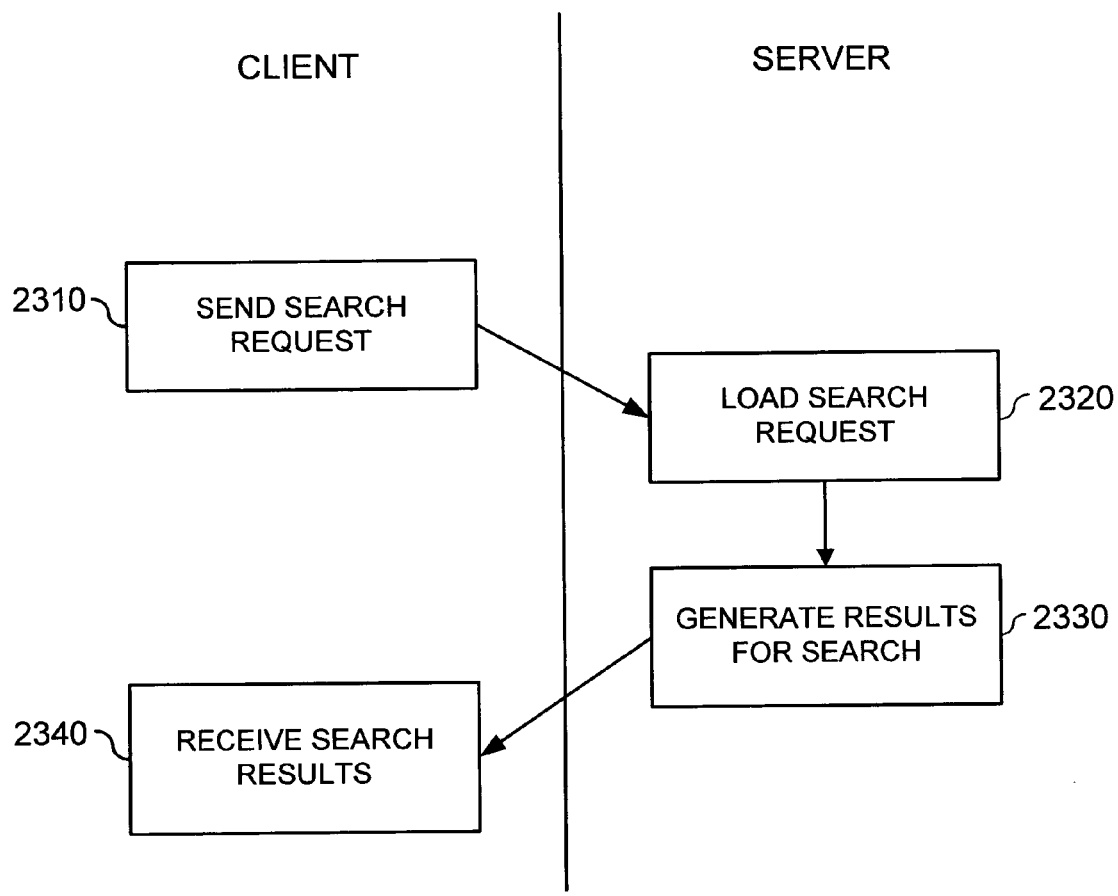
FIG. 23 is a diagram illustrating an embodiment of a method of searching a tree representation of a programmable device using a client-server network, such as the one illustrated in FIG. 22.

FIG. 23 shows that a device layout may be searched according to the disclosed method using a remote server computer, such as a server computer 2210 in FIG. 22. In process block 2310, the client computer sends data relating to a search request. In process block 2320, the data is received and loaded by the server computer. In process block 2330, the method disclosed above is performed and the search of the tree structure is completed. In process block 2340, the client computer receives the results for the search request sent by the server computer.

Having described and illustrated the principles of our invention with reference to the illustrated embodiments, it will be recognized that the illustrated embodiments can be modified in arrangement and detail without departing from such principles.

It should be understood that the programs, processes, or methods described herein are not related or limited to any particular type of computer apparatus. Various types of general purpose or specialized computer apparatus may be programmed for use with or to perform operations in accordance with the teachings described herein.

Actions described herein can be achieved through the use of computer-readable media comprising computer-executable instructions for performing such actions. Elements of the illustrated embodiment shown in software may be implemented in hardware and vice versa. In view of the many possible embodiments to which the principles of our invention may be applied, it should be recognized that the detailed embodiments are illustrative only and should not be taken as limiting the scope of our invention. Rather, the invention is directed to new and unobvious features and method acts disclosed herein, both individually and in subcombinations and combinations thereof, as defined by the following claims. The methods and apparatus are not limited to technology which overcomes all or any specific disadvantages of known technology or to any specific combination(s) of features or method acts. We therefore claims as our invention all suchy embodiments that come within the scope of these claims.

I claim:

1. A computer implemented method for representing a layout of a programmable device as a tree structure to be searched by a computer program for determining a configuration of functional components within a selected portion of an area occupied by the layout, the method comprising:

dividing the area occupied by the device layout into one or more main area portions;

representing each main area portion as a corresponding root node on the tree structure;

dividing each main area portion into equally sized sub-areas;

representing each sub-area as a branch node that is a child of the root node corresponding to the main portion comprising the sub-area;

continuing to divide each sub-area further into equally sized sub-areas and representing each sub-area as a branch node, until the sub-areas correspond to a base layout unit of the device layout, the base layout unit being a base unit in the tree structure that cannot be further subdivided;

representing each of the sub-areas corresponding to the layout unit of the device layout as a leaf node on the tree structure; and for a straddling layout unit that is larger than one of the equally-sized sub-areas, associating the straddling layout unit with multiple of the equally sized sub-areas and assigning multiple leaf nodes to the equally sized sub-areas of the straddling layout unit so that a search that encompasses any of the multiple leaf nodes associated with the straddling layout unit returns the straddling layout unit in associated search results, and wherein the straddling layout unit includes no sub-parts that are individually searchable.

2. The method of claim 1 wherein the layout the programmable device comprises pre-defined layout units with each layout unit occupying an area with a size that is a multiple of the area occupied by a basic layout unit of the device.

3. The method of claim 1 wherein the programmable device is an FPGA.

4. The method of claim 1 wherein the programmable device is a PAL, a PLA, a gate array ASIC, or a CPLD.

5. The method of claim 1 wherein one of the main area portions comprises a core area of the area occupied by the programmable device layout.

6. The method of claim 1 wherein the main area portions comprise I/O areas of the device layout.

7. The method of claim 1 further comprising:

representing a non-uniform layout unit straddling across multiple sub-areas as a separate root node;

assigning faux cell units to represent area of the device layout occupied by the non-uniform straddling layout unit;

representing the faux cell units as leaf nodes under the root node representing one of the main area portions of the area occupied by device layout; and assigning pointers to each of the faux cell units to point to the root node representing the non-uniform straddling layout unit.

8. The method of claim 7, wherein a area size of one of the faux cell units is a multiple of an area size of a basic layout unit of the device layout.

9. A tangible computer readable storage medium containing a tree structure for representing physical area occupied by a layout of a programmable device to be used by a computer program for searching selected areas of the device layout to identify functional units of the device layout comprised therein, the tree structure comprising:

one or more root nodes representing one or more main portions of the physical area occupied by the device layout;

one or more branch nodes representing equally sized sub-areas within one or more main portions of the physical area occupied by the device layout;

one or more leaf nodes for representing the physical area occupied by the units of a device layout; and wherein for a component that is larger than the units of the device layout, dividing the component into multiple units and, for each such unit associated with the component, assigning a leaf node to the unit so that a single component is represented by at least two leaf nodes so that a search that encompasses any of the at least two leaf nodes returns the component in associated search results, wherein the component includes no sub-parts that are separately searchable.

10. The computer readable medium of claim 9 wherein one of the main portions of the physical area occupied by the device corresponds to a core area of the device.

11. The computer readable medium of claim 9 wherein a size of the sub-area represented by children nodes of one of the branch nodes of the tree structure is different than a size of the sub-area represented by children nodes of the other branch nodes.

12. The computer readable medium of claim 9 wherein the device layout comprises pre-determined layout units with each layout unit occupying an area of a size that is a multiple of the area occupied by a basic layout unit of the device layout.

13. The computer readable medium of claim 9 wherein the device being represented by the tree structure is an FPGA, PAL, CPLD, a gate array ASIC or a CPLD.

14. The computer readable medium of claim 9 further comprising faux leaf nodes for representing the physical area occupied by a non-uniform layout unit that straddles across multiple sub-areas and a separate root node to represent the non-uniform straddling layout unit.

15. The computer readable medium of claim 14, wherein the faux leaf nodes have a pointer field for associating the faux leaf nodes with the root node representing the non-uniform straddling layout unit.

16. The computer readable medium of claim 14 wherein a size of a sub-area associated with the faux nodes is a multiple of a size of an area associated with a basic layout unit of the device.

17. The computer readable medium of claim 14 wherein the faux nodes are represented at multiple different levels of the tree structure.

18. A computer implemented method for searching a layout of a programmable device for determining information related to components of the device wherein the device comprises pre-defined layout units with each unit being of a size that is a multiple of a size of a basic layout unit of the device layout, the method comprising:

receiving data related to selection of a physical area of the device layout to be searched;

retrieving a tree structure representative of the device layout, wherein the tree structure represents main portions of the device as roots of the tree structure, equally sized sub-areas of the main portions are represented as branches of the tree structure and layout units within the device layout are represented as leaf nodes of the tree structure;

for a straddling component that is larger than the basic layout unit, dividing the straddling component into multiple basic layout units and, for each such basic layout unit associated with the straddling component, assigning a leaf node to the basic layout unit so that a single component is represented by at least two leaf nodes; and searching the tree structure starting with the root node and ending with the leaf nodes and recording data, in a computer, related to components associated with the leaf nodes, wherein a search that includes the at least two leaf nodes, returns the straddling component in a search result.

19. A method of representing the layout of a programmable device as a tree structure, the method comprising:

designating, in a computer, at least a first portion of an area occupied by the programmable device layout containing a plurality of layout units as a first root portion of a tree structure;

dividing the first root portion into a plurality of equally sized branch portions;

determining whether the area occupied by any of the branch portions correspond to one of the layout units, and if so, designating any such branch portions which correspond with a layout units as a separate leaf portion of the tree structure;

further dividing any of the remaining branch portions which do not correspond to one of the layout units into a plurality of equally sized sub-branch portions;

determining whether any of the sub-branch portions correspond to one of the layout units, and if so, designating any such sub-branch portions which correspond with a layout units as a separate leaf portion of the tree structure;

repeating the further dividing and determining acts until all layout units of the first portion of the programmable device have been represented as separate leaf portions of the tree structure;

for a straddling component that is larger than a smallest, base layout unit, dividing the straddling component into multiple base layout units and, for each such base layout unit associated with the straddling component, assigning a leaf node to the base layout unit so that a single component is represented by at least two leaf nodes;

searching the tree structure and in response to finding one or more of the at least two leaf nodes, returning the straddling component as a search result, wherein the straddling component includes no sub-parts that are individually searchable.

* * * * *

UNITED STATES PATENT AND TRADEMARK OFFICE
CERTIFICATE OF CORRECTION

PATENT NO. : 7,607,117 B2  
APPLICATION NO. : 11/295107  
DATED : October 20, 2009  
INVENTOR(S) : Kuoching Lin Page 1 of 1

It is certified that error appears in the above-identified patent and that said Letters Patent is hereby corrected as shown below:

IN THE CLAIMS:

Column 11,
Line 53, "wherein a area" should be --wherein an area--.

Signed and Sealed this
Twenty-ninth Day of March, 2016

Michelle K. Lee
*Director of the United States Patent and Trademark Office*